United States Patent
Goma et al.

(10) Patent No.: US 7,596,743 B2
(45) Date of Patent: Sep. 29, 2009

(54) METHOD AND APPARATUS FOR ERROR MANAGEMENT

(75) Inventors: Sergiu Goma, Markham (CA); Milivoje Aleksic, Markham (CA)

(73) Assignee: ATI Technologies Inc., Markham, Ontario (CA)

( * ) Notice: Subject to any disclaimer, the term of this patent is extended or adjusted under 35 U.S.C. 154(b) by 622 days.

(21) Appl. No.: 11/236,921

(22) Filed: Sep. 28, 2005

(65) Prior Publication Data

US 2007/0089044 A1    Apr. 19, 2007

(51) Int. Cl.
  *H03M 13/00* (2006.01)
(52) U.S. Cl. ............... 714/777; 714/800; 714/755; 714/786
(58) Field of Classification Search .......... 714/755, 714/777, 786, 800
  See application file for complete search history.

(56) References Cited

U.S. PATENT DOCUMENTS

| 5,479,416 A * | 12/1995 | Snodgrass et al. ......... 714/785 |
| 2001/0030955 A1 * | 10/2001 | Lee et al. .................. 370/342 |
| 2005/0149834 A1 | 7/2005 | Chen |

FOREIGN PATENT DOCUMENTS

| EP | 0 862 296 A2 | 9/1998 |
| EP | 1 175 034 A2 | 1/2002 |
| WO | WO 01/91497 A1 | 11/2001 |

OTHER PUBLICATIONS

Jones, A.E. et al., "Combined Coding for Error Control and Increased Robustness to System Nonlinearities in OFDM", Vehicular Technology Conference, 1996, Mobile Technology for the Human Race, IEEE 46th Atlanta, GA, USA Apr. 28-May 1, 1996, New York, NY, IEEE, US, vol. 2, Apr. 28, 1996, pp. 904-908.

* cited by examiner

*Primary Examiner*—Guy J Lamarre
(74) *Attorney, Agent, or Firm*—Smart & Biggar

(57) ABSTRACT

To derive a Hamming code to manage data errors a set of at least four parity bit positions is selected for parity bits which will protect a set of data bits (where each data bit has a data bit position in the data bit set). A syndrome is determined for each data bit position. This involves selecting a unique sub-set of at least three parity bit positions. The unique sub-set shares at least one parity bit position with at least one other unique sub-set of at least three parity bit positions. A parity bit value may then be calculated for each parity bit position based on the determined syndromes. The header of a packet may be provided with a word which defines the length of the packet and an error management code generated utilizing this word so that errors in the word may be detected and, possibly, corrected.

30 Claims, 7 Drawing Sheets

| Bit | P7 | P6 | P5 | P4 | P3 | P2 | P1 | P0 | Hex |
|---|---|---|---|---|---|---|---|---|---|
| 0 | 0 | 0 | 0 | 0 | 0 | 1 | 1 | 1 | 0x07 |
| 1 | 0 | 0 | 0 | 0 | 1 | 0 | 1 | 1 | 0x0B |
| 2 | 0 | 0 | 0 | 0 | 1 | 1 | 0 | 1 | 0x0D |
| 3 | 0 | 0 | 0 | 0 | 1 | 1 | 1 | 0 | 0x0E |
| 4 | 0 | 0 | 0 | 1 | 0 | 0 | 1 | 1 | 0x13 |
| 5 | 0 | 0 | 0 | 1 | 0 | 1 | 0 | 1 | 0x15 |
| 6 | 0 | 0 | 0 | 1 | 0 | 1 | 1 | 0 | 0x16 |
| 7 | 0 | 0 | 0 | 1 | 1 | 0 | 0 | 1 | 0x19 |
| 8 | 0 | 0 | 0 | 1 | 1 | 0 | 1 | 0 | 0x1A |
| 9 | 0 | 0 | 0 | 1 | 1 | 1 | 0 | 0 | 0x1C |
| 10 | 0 | 0 | 1 | 0 | 0 | 0 | 1 | 1 | 0x23 |
| 11 | 0 | 0 | 1 | 0 | 0 | 1 | 0 | 1 | 0x25 |
| 12 | 0 | 0 | 1 | 0 | 0 | 1 | 1 | 0 | 0x26 |
| 13 | 0 | 0 | 1 | 0 | 1 | 0 | 0 | 1 | 0x29 |
| 14 | 0 | 0 | 1 | 0 | 1 | 0 | 1 | 0 | 0x2A |
| 15 | 0 | 0 | 1 | 0 | 1 | 1 | 0 | 0 | 0x2C |
| 16 | 0 | 0 | 1 | 1 | 0 | 0 | 0 | 1 | 0x31 |
| 17 | 0 | 0 | 1 | 1 | 0 | 0 | 1 | 0 | 0x32 |
| 18 | 0 | 0 | 1 | 1 | 0 | 1 | 0 | 0 | 0x34 |
| 19 | 0 | 0 | 1 | 1 | 1 | 0 | 0 | 0 | 0x38 |
| 20 | 0 | 0 | 0 | 1 | 1 | 1 | 1 | 1 | 0x1F |
| 21 | 0 | 0 | 1 | 0 | 1 | 1 | 1 | 1 | 0x2F |
| 22 | 0 | 0 | 1 | 1 | 0 | 1 | 1 | 1 | 0x37 |
| 23 | 0 | 0 | 1 | 1 | 1 | 0 | 1 | 1 | 0x3B |
| 24 | 0 | 1 | 0 | 0 | 0 | 0 | 1 | 1 | 0x43 |
| 25 | 0 | 1 | 0 | 0 | 0 | 1 | 0 | 1 | 0x45 |

| 12 | 14 | | | | | | | 16 |
|---|---|---|---|---|---|---|---|---|
| 26 | 0 | 1 | 0 | 0 | 0 | 1 | 1 | 0 | 0x46 |
| 27 | 0 | 1 | 0 | 0 | 1 | 0 | 0 | 1 | 0x49 |
| 28 | 0 | 1 | 0 | 0 | 1 | 0 | 1 | 0 | 0x4A |
| 29 | 0 | 1 | 0 | 0 | 1 | 1 | 0 | 0 | 0x4C |
| 30 | 0 | 1 | 0 | 1 | 0 | 0 | 0 | 1 | 0x51 |
| 31 | 0 | 1 | 0 | 1 | 0 | 0 | 1 | 0 | 0x52 |
| 32 | 0 | 1 | 0 | 1 | 0 | 1 | 0 | 0 | 0x54 |
| 33 | 0 | 1 | 0 | 1 | 1 | 0 | 0 | 0 | 0x58 |
| 34 | 0 | 1 | 1 | 0 | 0 | 0 | 0 | 1 | 0x61 |
| 35 | 0 | 1 | 1 | 0 | 0 | 0 | 1 | 0 | 0x62 |
| 36 | 0 | 1 | 1 | 0 | 0 | 1 | 0 | 0 | 0x64 |
| 37 | 0 | 1 | 1 | 0 | 1 | 0 | 0 | 0 | 0x68 |
| 38 | 0 | 1 | 1 | 1 | 0 | 0 | 0 | 0 | 0x70 |
| 39 | 1 | 0 | 0 | 0 | 0 | 0 | 1 | 1 | 0x83 |
| 40 | 1 | 0 | 0 | 0 | 0 | 1 | 0 | 1 | 0x85 |
| 41 | 1 | 0 | 0 | 0 | 0 | 1 | 1 | 0 | 0x86 |
| 42 | 1 | 0 | 0 | 0 | 1 | 0 | 0 | 1 | 0x89 |
| 43 | 1 | 0 | 0 | 0 | 1 | 0 | 1 | 0 | 0x8A |
| 44 | 0 | 0 | 1 | 1 | 1 | 1 | 0 | 1 | 0x3D |
| 45 | 0 | 0 | 1 | 1 | 1 | 1 | 1 | 0 | 0x3E |
| 46 | 0 | 1 | 0 | 0 | 1 | 1 | 1 | 1 | 0x4F |
| 47 | 0 | 1 | 0 | 1 | 0 | 1 | 1 | 1 | 0x57 |
| 48 | 1 | 0 | 0 | 0 | 1 | 1 | 0 | 0 | 0x8C |
| 49 | 1 | 0 | 0 | 1 | 0 | 0 | 0 | 1 | 0x91 |
| 50 | 1 | 0 | 0 | 1 | 0 | 0 | 1 | 0 | 0x92 |
| 51 | 1 | 0 | 0 | 1 | 0 | 1 | 0 | 0 | 0x94 |
| 52 | 1 | 0 | 0 | 1 | 1 | 0 | 0 | 0 | 0x98 |

FIG. 1B

METHOD AND APPARATUS FOR ERROR MANAGEMENT

BACKGROUND

The present invention relates to data bit error management and to a structure for, and method of, assembling a data packet.

Whenever binary data is transmitted, there exists the possibility of an error being introduced to the data during transmission. For this reason, various error detection and error correction schemes exist. One area where errors during transmission can cause difficulties is where the data is packetised. In systems that communicate data serially and asynchronously, the data is typically embedded in packets, with packets being transmitted whenever there is data to send. A packet normally has a packet header, followed by the data which is the payload of the packet, and possibly terminating in a packet footer. The header provides some information about the packet as, for example, the source of the packet, or the type of data included in the packet. If a packet which is received differs from the packet that was sent and this is detected by an error detecting scheme, the receiver may discard the corrupted packet and send a re-try request to the transmitter. However, forcing a re-try slows data throughput. Further, an error which corrupts a packet in such a way that the end of the packet is not detected may cause particular problems.

This invention seeks to provide an improved approach for managing errors in data communications.

SUMMARY OF INVENTION

One aspect of the invention proposes a Hamming code to manage data errors. A set of at least four parity bit positions is selected for parity bits which will protect a set of data bits (where each data bit has a data bit position in the data bit set). A syndrome is determined for each data bit position. This involves selecting a unique sub-set of at least three parity bit positions. The unique sub-set shares at least one parity bit position with at least one other unique sub-set of at least three parity bit positions. A parity bit value may then be calculated for each parity bit position based on the determined syndromes.

In another aspect of the invention, the header of a packet is provided with a word which defines the length of the packet and an error management code is generated utilizing this word so that errors in the word may be detected and, possibly, corrected.

According to this invention, there is provided a data bit error management method comprising: selecting a set of parity bit positions for parity bits to protect a set of data bits, each data bit having a data bit position in said data bit set, said number of parity bits being at least four; associating each data bit position with a different syndrome, each syndrome comprising a sub-set of at least three parity bit positions, such that each said sub-set has at least one parity bit position shared with at least one other said sub-set; and calculating a parity bit value for each parity bit position from all data bit positions associated with said each parity bit position. A transmitter and computer readable media implementing this method are also provided.

In another aspect, there is provided a receiver comprising: a parity generator for generating a set of at least four parity bits from a set of received data bits, each parity bit having a parity bit position in said parity bit set, each received data bit having a data bit position in said data bit set; said parity generator associating each data bit position with a different syndrome, each syndrome comprising a sub-set of at least three parity bit positions, such that each said sub-set has at least one parity bit position shared with at least one other said sub-set; and said parity bit generator calculating a parity bit value for each parity bit position from all data bit positions associated with said each parity bit position.

In a further aspect, there is provided a method of assembling a data packet comprising: selecting payload data for said packet; deriving a data length word based on a length of said payload data; deriving an error management code dependent on said data length word; assembling said payload data, said data length word and said error management code into a packet. A transmitter to transmit such a packet is also provided.

In another aspect, there is provided a method of handling a received data packet comprising: said received packet comprising a header and payload data, said header comprising a data length word and a received error management code; deriving a derived error management code dependent on said data length word; comparing said received error management code with said derived error management code and, based on said determination, selectively correcting said data length word. A related receiver is also provided.

Other features and advantages of the present invention will be apparent from a review of the following detailed description in conjunction with the drawings.

BRIEF DESCRIPTION OF THE DRAWINGS

In the figures which illustrate an example embodiment of the invention.

DETAILED DESCRIPTION

Figure 1A:
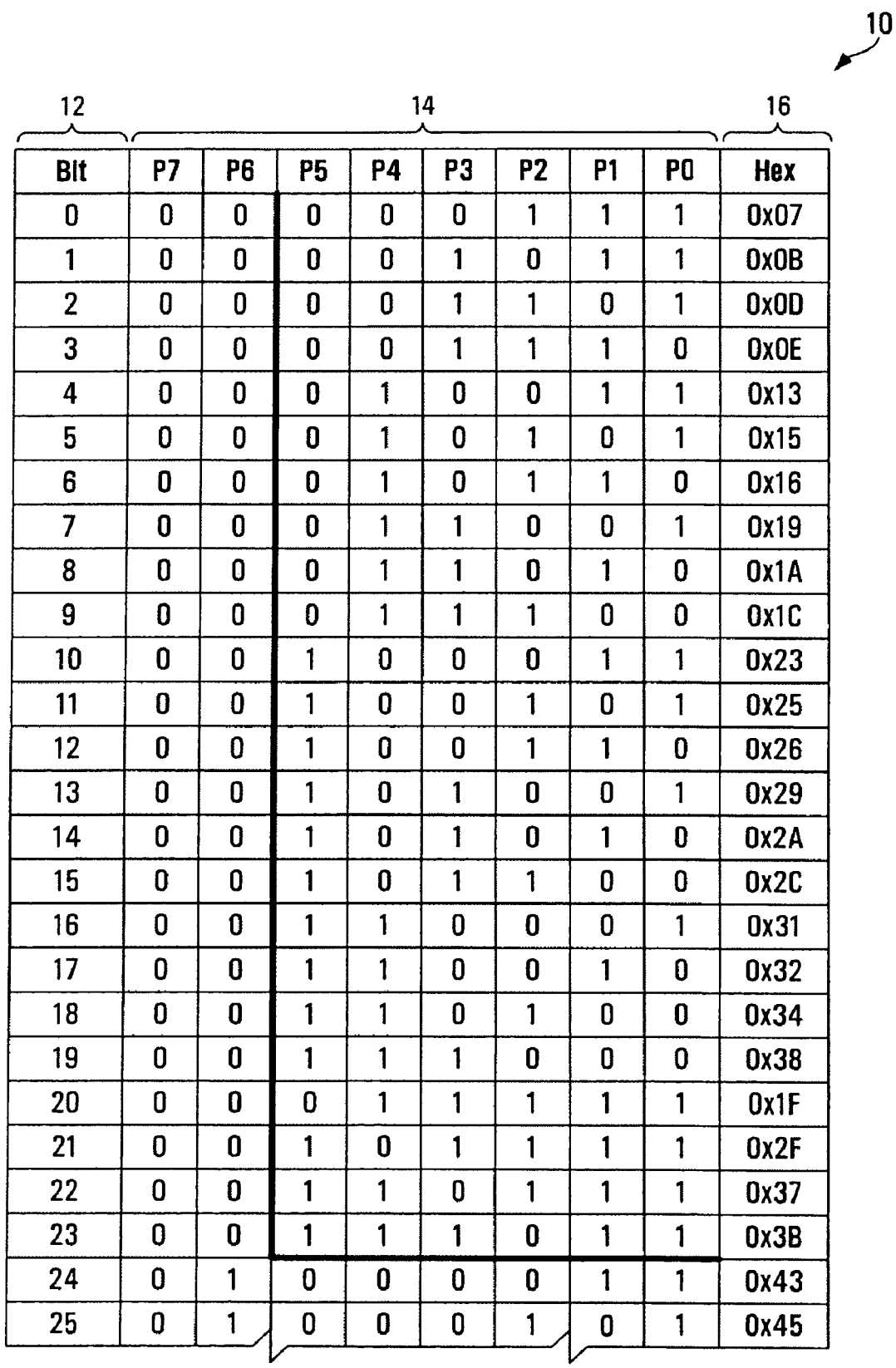
FIG. 1 (comprising FIGS. 1A, 1B, 1C) is a table illustrating an embodiment of this invention.

Hamming codes are one known manner of detecting and correcting errors in data communications. A standard Hamming code is capable of correcting a single bit error in a set of data bits, but will produce erroneous results if two data bits are in error. To address this problem, a modified Hamming code is known which can not only correct a single bit error but can also distinguish between a single bit error and a double bit error. Hamming codes are therefore particularly useful in any data communications systems where the bit error rate (BER) is small (such that in all likelihood any one set of data bits transmitted has at most one error).

To employ a Hamming code with a set of data bits that is to be transmitted, a series of parity bits (also known as check bits) are calculated from the data bits, and then these calculated parity bits are added to the set of data bits prior to transmission to create what is known as a Hamming codeword. The key to a Hamming code is that each parity bit is calculated from a unique sub-set of the data bits, but these sub-sets overlap. In consequence, any given data bit contributes to the calculation of more than one parity bit and any one parity bit is calculated from more than one data bit. With an appropriate choice of the number of parity bits and equations for their calculation, a Hamming code can isolate and correct an errant data bit in a set of data bits.

The minimum number of parity bits used in a Hamming codeword is dependent upon the number of data bits in the set of data bits to be transmitted. Specifically, as is known, the following is required:

$$d+p+1<=2^p \quad (1)$$

where d is the number of data bits in the set of data bits to be transmitted and p is the number of parity bits to be added.

A standard Hamming code interleaves parity bits at pre-defined bit positions in the set of data bits, specifically, at each bit position which is a power of two. Thus, there will be a parity bit at bit positions 1, 2, 4, 8, 16, 32, 64, . . . and data bits are displaced to the next higher available bit position to allow this interleaving. To determine which data bits contribute to the calculation of which parity bits, each bit position is decomposed into a sum of numbers which are a power of two. The data bit at that bit position is then used in the equations which calculate the parity bits for the bit positions which are at those power of two locations. For example, bit position 6 decomposes to a sum of 4+2. Hence, the data bit at bit position 6 will be used in the equation to calculate the parity bit at bit position 4 and in the equation to calculate the parity bit at bit position 2.

Since every number will decompose into a different sum of power of two numbers, this approach ensures that every data bit contributes to the determination of a different sub-set of parity bits. Further, numbers will decompose into power of two numbers with overlapping terms. For example, 7 decomposes to 4+2+1 whereas 13 decomposes to 8+4+1, such that these two numbers share the power of two terms 4 and 1.

The equation to calculate each parity bit is simply an exclusive OR (XOR) operation performed serially on all the data bits which contribute to the determination of the parity bit.

After determination of the parity bits, they are interleaved with the data word, as aforenoted, to result in a Hamming codeword which is ready for transmission. At the receiver the data bits are extracted from the codeword and used to calculate the parity bits. If all of the calculated parity bits are identical to the parity bits which are actually received in the codeword, the receiver concludes there has been no error. However, if there is disagreement between any of the received and calculated parity bits—which may be determined by an XOR operation—an error may be determined to have occurred. The word resulting from the (XOR) comparison of the calculated check bits with the received check bits is known as the syndrome. The foregoing may be illustrated by the following.

Say during transmission of the codeword a single data bit, Z, went bad (i.e., the bit was inverted from a 1 to a 0 or from a 0 to a 1). In such instance, when the receiver calculates each of the parity bits to which data bit Z contributes, the calculated values for this unique sub-set of parity bits will all differ from the received values for the sub-set. That is to say, after the receiver calculates the parity bits from received data bits, it will find that a sub-set of calculated parity bits differs from the received parity bits and that this sub-set is the unique sub-set of parity bits to which data bit Z contributes. Thus, the determined sub-set of "bad" parity bits points directly to the data bit in error. Further, since this unique sub-set of parity bits is at the bit positions represented by the power of two decomposition of the bit position of data bit Z, the identity of the bad data bit falls out directly from the identification of the bad parity bits.

A simple example will illustrate the foregoing. Say a set of three data bits is to be sent. From equation (1), we require that $3+p+1<=2^p$ so that $p>=3$. Choosing the minimum number of parity bits, three, we need parity bits at bit positions 1, 2, and 4. Therefore, if C represents a parity bit and D a data bit and subscripts are used to represent bit positions, the set of three data bits is modified so that the sequence $C_1 C_2 D_3 C_4 D_5 D_6$ will be sent.

Bit position three decomposes to 2+1, bit position five decomposes to 4+1, and bit position six decomposes to 4+2. Therefore, the parity bit at bit position one, $C_1$, is calculated from the data bits at bit positions three and five, the parity bit at bit position two, $C_2$, is calculated from the data bits at bit positions three and six, and the parity bit at bit position four, $C_4$, is calculated from the data bits at bit positions five and six. The specific equations to calculate these parity bits are as follows:

$$C_1 = D_3 \char`\^ D_5 \quad (2)$$

$$C_2 = D_3 \char`\^ D_6 \quad (3)$$

$$C_4 = D_5 \char`\^ D_6 \quad (4)$$

where "^" represents an XOR operation. If the set of three data bits to be transmitted were 100 then we have: $C_1 C_2 1_3 C_4 0_5 0_6$. The three parity bits may be calculated from equations (2) to (4) so that the resulting codeword to be transmitted is 111000.

If, at the receiver, the bit sequence 111001 were received, such that the data bit in position six has gone had, the Hamming code can be used to correct this error, as follows. Based on the received data bits, the receiver calculates what the parity bits should have been using equations (2) through (4). Such calculations set $C_1=1; C_2=0;$ and $C_4=1$. But the received values of $C_2$ and $C_4$ are different from the calculated values. This means that the data bit at bit position 2+4=6 is wrong. And so the data bit in bit position six is complemented (inverted) to correct the error.

If, rather than a single data bit error, there was a single parity bit error, only the parity bit equation for that parity bit would return a calculated value different from the received value. Thus, a single parity bit error can be readily identified and ignored.

A problem with using the minimum number of parity bits in a codeword is that, while the Hamming code may isolate and correct a single bit error, it cannot distinguish between a single bit error and a double bit error. Thus, using the same example, if during transmission both data bits 3 and 6 went bad then the sequence 111011 would be received. Now calculation of the parity bits results in $C_1=0; C_2=0;$ and $C_4=1$, thereby erroneously suggesting that data bit $D_3$ went bad during transmission.

To solve this problem, one additional parity bit may be used. This additional parity bit, which may be referred to as a protection bit, may be calculated from an XOR of all of the data bits and other added parity bits. Consequently, if there are zero or two errors after transmission, the receiver will calculate the same value for the protection bit from the codeword as was calculated at the transmitter whereas if there is one error, the receiver will calculate a different value for the protection bit. Therefore, by comparing the received protection bit with the calculated protection bit, the receiver can distinguish between a single error and a double error.

A drawback with the standard and modified Hamming code is that they are vulnerable to aliasing from higher order errors. That is to say, while the modified Hamming code may correct a single error and determine when there has been a double error, it may be fooled into determining that a higher order error, such as a three bit error, is a single bit error. Additionally, the described Hamming code techniques require that all transmitters and receivers behave in the same way in order to properly interpret the received codeword.

One of the difficulties we perceived with the described Hamming code is that decomposing data bit positions to a sum of power of two numbers to select a unique sub-set of parity bits more heavily utilizes the parity bits at the lower bit positions. For example, given a 33 bit data word, very few data bit positions will decompose to a power of two number which includes the number 32 whereas many will decompose to a power of two number which includes the number 1. Consequently, few data bits will contribute to the calculation of the parity bit at bit position 32 whereas many will contribute to the calculation of the parity bit at bit position 1. Those data bits which contribute to the determination of the fewest number of parity bits are most vulnerable to higher order error aliasing. This is because it is easier for a higher order error to mimic an error determined by relatively few sample points.

Therefore, to better balance a Hamming codeword such that the determination of errors in each bit position is more equally robust, each data bit is made to contribute to the determination of as equal a number as possible of parity bits. In other words, each sub-set of parity bits to which a given data bit contributes is chosen so that the number of sub-sets which are of equal size is maximized. This result is easier to achieve if there are more parity bits for the simple reason that, for a given number of parity bits in each sub-set, there are more unique sub-sets of parity bits to choose from. For example, there are more unique sub-sets of three parity bits in a universe of six parity bits than there are in a universe of five parity bits. To increase the universe of parity bits without adding additional overhead bits as compared with the afore-described modified Hamming code, the described protection bit (which is an XOR of the entire Hamming codeword) is instead employed as a regular parity bit (the determination of which will be contributed to by certain of the data bits).

Mathematically, the extra parity bit means that the number of parity bits, rather than being determined by equation (1), is instead determined by equation (5), as follows:

$$d+p+1<2^p \qquad (5)$$

where, as before, d is the number of data bits in the set of data bits to be transmitted and p is the number of parity bits to be added.

No matter how many data bits there are, as long as there are enough parity bits available so that each data bit can contribute to the determination of a unique sub-set of parity bits, and these sub-sets of parity bits overlap, single bit error detection is guaranteed. However, it is also preferred that the Hamming code distinguish single bit errors at least from double bit errors. This may be guaranteed if (i) each data bit contributes to the calculation of at least three parity bits and (ii) either all data bits contribute to an odd number of parity bits or all data bits contribute to an even number of parity bits. Put more mathematically, preferably (but not necessarily) all data bits contribute to either 2n+1 or 2n+2 parity bits, where n is a positive integer.

The need for criterion (i) may be seen from the following. Assume data bit A contributed only to the calculation of $C_1$ and $C_2$ and data bit B contributed only to the calculation of $C_2$ and $C_3$. If, after transmission A was bad, $C_1$ and $C_2$ would also be bad (i.e., the calculated values for $C_1$ and $C_2$ would differ from the received values). However, if after transmission, A and B were bad, $C_1$ and $C_3$ would be bad, but $C_2$ would appear to be good. Now if data bit Z contributed only to $C_1$ and $C_3$, the error would be confused as a one bit error. On the other hand, if each data bit contributed to the equations for the determination of three parity bits, then A might contribute to the equation for $C_1$, $C_2$ and $C_3$ and B to $C_2$, $C_3$ and $C_4$. Now if A goes bad, $C_1$ and $C_3$ go bad, but if B goes bad too, then $C_1$ stays bad, $C_2$ and $C_3$ appear good, and $C_4$ goes bad. But since at least three parity bits must be bad to indicate a single bit error, it may be concluded that, given only two check bits are bad, there has been an error which is not a single bit error.

The need for criterion (ii) may be seen from the following. If it were possible for data bits to contribute to either an odd or an even number of parity bit equations, data bit A may contribute to the equations for $C_1$, $C_2$ and $C_3$ and data bit B may contribute to the equations for $C_1$, $C_2$, $C_3$, and $C_4$. Then if during transmission data bit A went bad and there was an error in transmitting parity bit $C_4$, the receiver would consider that each of parity bits $C_1$, $C_2$, $C_3$, and $C_4$ were bad and so consider data bit B to be bad. On the other hand, if data bit B had instead contributed to five parity bit equations, it will be readily seen that the receiver would correctly distinguish this double bit error.

Criteria (i) and (ii) are satisfied if data bits contribute to any of three, five, seven, or any higher odd number of parity bit equations or if data bits contribute to any of four, six, eight, or any higher even number of parity bit equations. Obviously, for each data bit to contribute to the equation for at least three parity bits, at least four parity bits are needed so that there are different sub-sets of three parity bits.

The proposed scheme may detect not only double bit errors but also some higher order bit errors. The resistance of the codeword to higher order aliasing could be further increased by increasing the number of parity bits to which each data bit contributes. However, this is at the cost of increased computational overhead (more gates). Therefore, given a sufficiently low BER, for any given set of data bits, it may be preferred to have the data bits contribute to as few parity bit equations as possible. This means, first creating all possible combinations of contribution to three parity bit equations, then if there are still more data bits in the set, next creating all possible combinations of contributions to five parity bit equations, and so on.

It is proposed to simply add the parity bits to one end of the data bits rather than interleaving them with the data bits. This allows the proposed Hamming codeword to be used by receivers which cannot decode the codeword itself, by simply ignoring the parity bit word at the beginning or end of the data bit word. The parity bit word may be referred to as an error management code or, alternatively, as an error correction code.

This approach requires that the parity bit equations are determined in advance, based upon the number of data bits in a set of data bits to be sent. This is in contrast to the afore-described standard and modified Hamming code which, because they are algorithmically based, may be used with different sized sets of data bits simply by applying the algorithm (i.e., placing parity bits at power of two locations and determining their value with the data bits which have that power of two in their power of two decomposition). Nevertheless, the new approach may be used with different sized sets of data words by determining in advance the different set of parity bit equations for each differently sized set of data bits. Indeed, the parity bit equations to which a data bit in a given bit position contributes may be the same for both a smaller set of data bits and a larger set of data bits.

The following describes an example of the use of this approach in protecting data words that may be either twenty-four or sixty-four bits in length.

From equation (5), to protect a set of twenty-four data bits with the proposed Hamming code, at least six parity bits are required and to protect a set of sixty-four data bits, at least eight parity bits are required. There are twenty unique sub-sets of three parity bit locations in a set of six parity bit locations and six different sub-sets of five parity bit locations in a set of six parity bit locations. Thus, six parity bits provide sufficient unique three and five parity bit sub-sets for use with twenty-four data bits. Similarly, it can be understood that eight parity bits provide sufficient unique three and five parity bit sub-sets for use with sixty-four data bits.

Figure 1C:
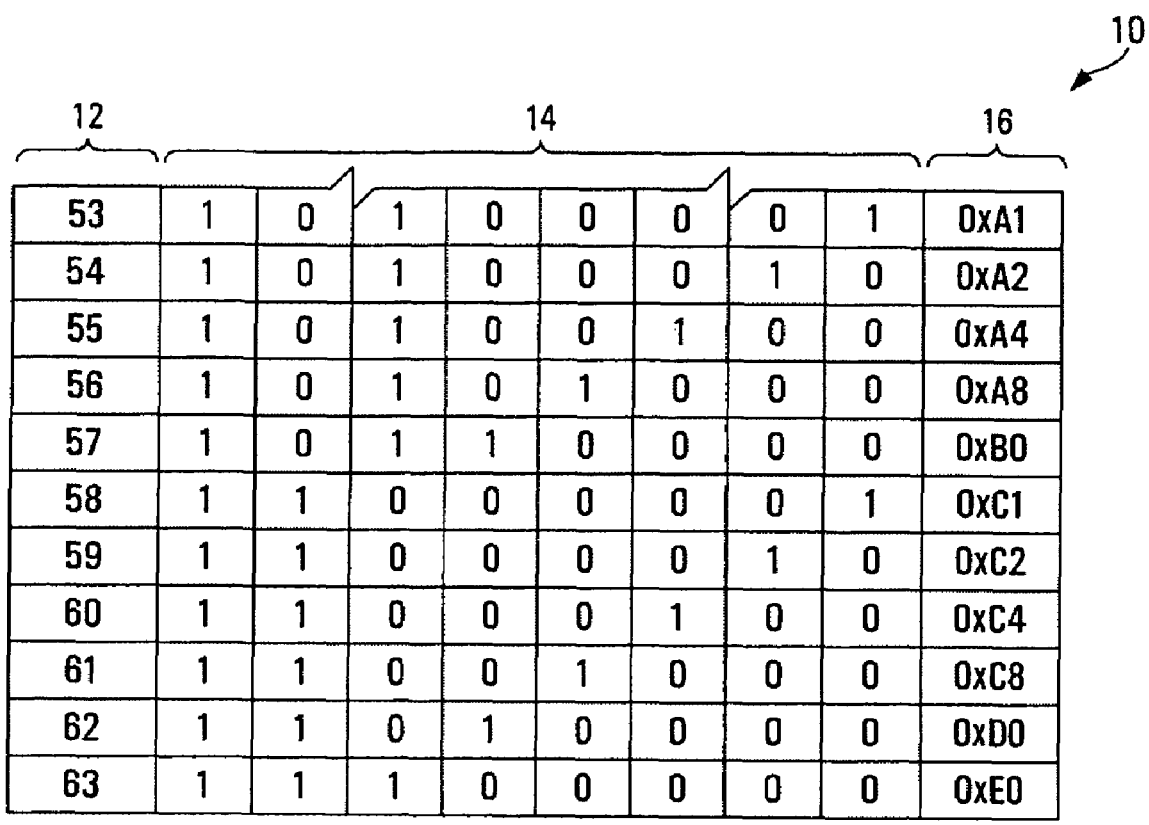

FIG. 1 is a table with one implementation of the foregoing. Turning to FIG. 1, the left hand column 12 of table 10 indicates bit positions for sixty-four bits and the middle columns 14 identify parity bit locations P0 to P7. A cell in a parity bit location column 14 has a 1 if the data bit in the row for that cell contributes to the equation for that parity bit and a 0 otherwise. Thus, for example, the data bit at data bit location 5 contributes to the calculation of parity bits P4, P2, and P0 and no others. Recalling that the equation for the calculation of a parity bit is simply a serial XOR operation, it can be seen from FIG. 1 that, given a twenty-four bit set of data bits, the equation for P0 is as follows:

$$P0_{24\text{-}bits} = D0\char`\^ D1\char`\^ D2\char`\^ D4\char`\^ D5\char`\^ D7\char`\^ D10\char`\^ D11\char`\^ D13\char`\^ D16\char`\^ D20\char`\^ D21\char`\^ D22\char`\^ D23 \quad (6)$$

Five parity bit combinations are more resistant to aliasing from higher order errors. However, higher order errors are less likely when sending a twenty-four bit word than when sending a sixty-four bit word. For this reason, table 10 uses all twenty of the possible three parity bit combinations in a six parity bit word for the first twenty-four data bit positions. This also keeps the number of parity bits that each data bit position contributes to as equal as possible for the first twenty-four data bit positions.

Because a 1 is entered in each cell where the data bit location contributes to the equation for that parity bit, the sub-set of parity bits associated with each data bit location is the syndrome for that data bit location. This can be appreciated from the following. Each data bit contributes to the calculation of a unique sub-set of parity bits. Consequently, if there is a single bit error during transmission, certain of the calculated parity bits will differ from the received parity bits. If the calculated and received parity bits are compared with an XOR operation, the resulting comparison word, which is known as the syndrome, will have a 1 at each parity bit location where there is a difference. This syndrome will therefore be found in table 10 at the row for the data bit which is in error. The syndrome may be represented as a hex (i.e., base 16) number as indicated in column 16 of table 10. Thus, the receiver could determine the hex value of a calculated syndrome and simply look for this value in table 10 to identify the data bit in error.

If the calculated base 2 syndrome had only a single 1 in it, this indicates a parity bit went bad during transmission and such an error can be ignored. Therefore, if the syndrome is not any of the syndromes in table 10, this indicates either an error in a check bit or a higher order error (e.g., a two or three bit error).

It will appreciated that the table of FIG. 1 is not unique in that the syndromes for any of the first twenty-four data bit positions could be swapped. For example, the syndromes for data bit positions 7 and 15 could be reversed. The same is also true for data bit positions twenty-five to sixty-four: the syndromes for any of these data bit positions may be swapped. All that is required is that the transmitter and receiver store the same table. However, the advantage of table 10 is that the syndromes appear in ascending numerical order, which facilitates quick searching of the table.

Figure 2:
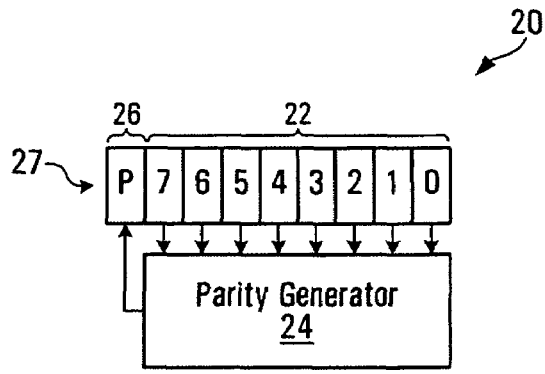
FIG. 2 is a schematic diagram of a portion of a transmitter made in accordance with one embodiment of this invention.

FIG. 2 illustrates a portion of a transmitter 20 for generating the proposed error correction code in respect of a sixty-four bit data word. The eight bytes 0 to 7 of the data word 22 may be passed to a parity generator 24 which implements table 10 of FIG. 1 to create an error correction code 26 which is appended to the front end of the data word. This Hamming codeword may placed in a buffer 27 and transmitted.

Figure 3:
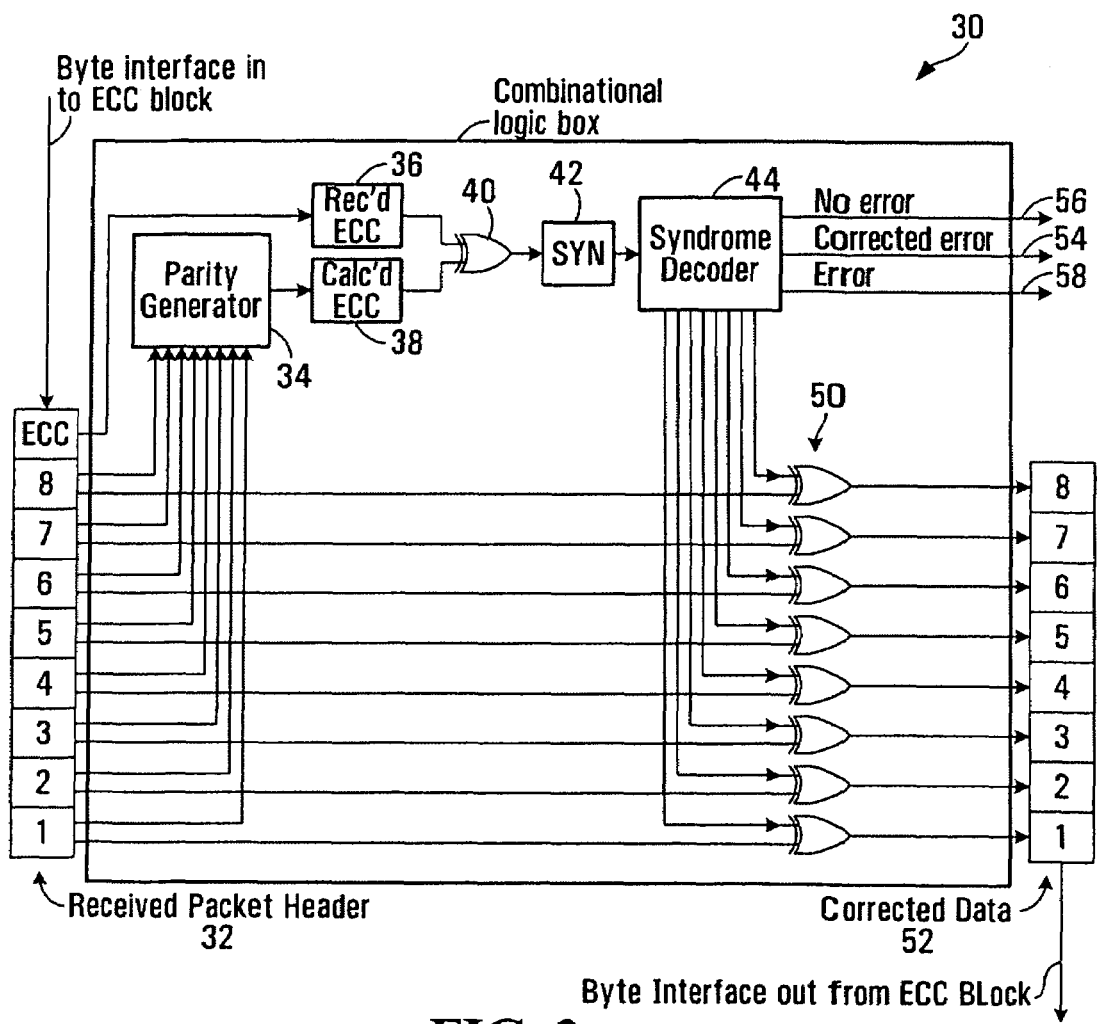
FIG. 3 is a schematic diagram of a portion of a receiver for use with the transmitter of FIG. 2.

FIG. 3 illustrates a portion of a receiver 30 for receiving the Hamming codeword. The eight bytes of the received data word 32 are passed through a parity generator 34 which also implements table 10 of FIG. 1. The parity generator therefore calculates parity bits from the received data bits in accordance with the parity bit equations indicated by table 10 in order to derive a calculated error correction code 38. The receiver reads the received error correction code 36 and compares this with the calculated error correction code 38 with XOR gates 40. The resulting word is the syndrome 42 which is passed to a syndrome decoder 44 which also has table 10 available to it. The syndrome decoder 44 uses the syndrome 42 to look up an entry in table 10. If an entry is found, the data bit at the data bit location indicated by the entry is considered bad. The data bit word 32 is passed to XOR gate array 50. The syndrome decoder outputs a 0 to each gate in the XOR gate array 50 except for the one gate which receives the bad data bit. The decoder outputs a 1 to that gate in order to complement, and therefore correct, the bad data bit. The corrected data word 52 is then output from the receiver along with an indication from the decoder 44 on line 54 that an error has been corrected. If the syndrome were zero, the decoder 44 would output an indication of no error on line 56. If the decoder could not find the syndrome in table 10, and if the syndrome does not merely have a single 1 in base 2 (indicating a parity bit error), the decoder would output an error indication on line 58.

Figure 4:
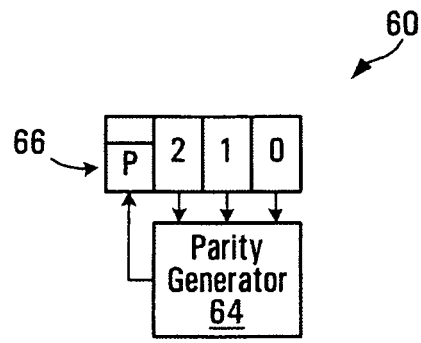
FIG. 4 is a schematic diagram of a portion of a transmitter made in accordance with another embodiment of this invention.

FIG. 4 illustrates a portion of a transmitter 60 for a twenty-four bit word. The three bytes 0 to 2 of the data word 62 may be passed to a parity generator 64 which implements table 10 of FIG. 1 to create an error correction code 66 which is appended to the front end of the data word. This Hamming codeword may then be transmitted.

Figure 5:
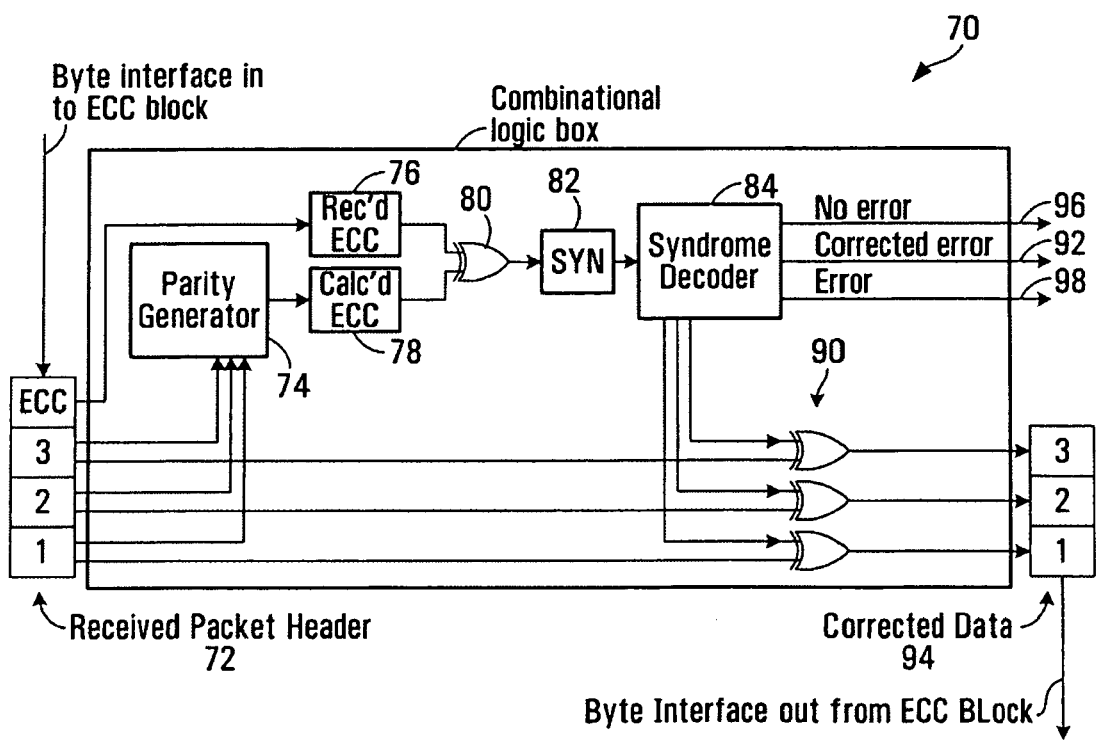
FIG. 5 is a schematic diagram of a portion of a receiver for use with the transmitter of FIG. 4.

FIG. 5 illustrates a portion of a receiver 70 for receiving the Hamming codeword. The three bytes of the received data word 72 are passed through a parity generator 74 which also implements table 10 of FIG. 1 to derive a calculated error correction code 78. The receiver reads the received error correction code 76 and compares this with the calculated error correction code 78 with XOR gates 80. The resulting word is the syndrome 82 which is passed to a syndrome decoder 84 which also has table 10 available to it. As described in connection with FIG. 3, the syndrome decoder 84 and XOR gate array 90 use the syndrome 82 to correct any single data bit error in the data word 94 which is output and indicate on lines 92, 96, and 98 the results of corrected error, no error or uncorrected error, respectively.

The set of data bits could be part of a packet header and comprises a word count (i.e., data length count) for the payload words in the packet. In such instance, the error correction code could also be part of the header and would manage (i.e., detect and, possibly, correct) bit errors in the word count.

Validation of the word count is particularly useful in ensuring that the end of the packet is properly detected.

As will be obvious to those skilled in the art, any data transmitter could be configured to add the described error correction code to a set of data bits for transmission so that an appropriately configured receiver could utilise the error correction code in determining a syndrome in order to manage errors in the transmitted set of data bits. Thus, the teachings of this invention may be applied in a wide range of communication systems. For example, the described error correction code approach may be used in a personal computer when communicating over the public Internet or when communicating with a peripheral. The described approach could also be used in a system comprising wireless handheld devices, such as mobile phones or portable e-mail client devices. The described approach could also be used to manage data errors in T.V. signals. From these examples, it will be obvious that the described error correction code approach can be used with transmitters and receivers for both wireline and wireless communication systems.

Figure 6:
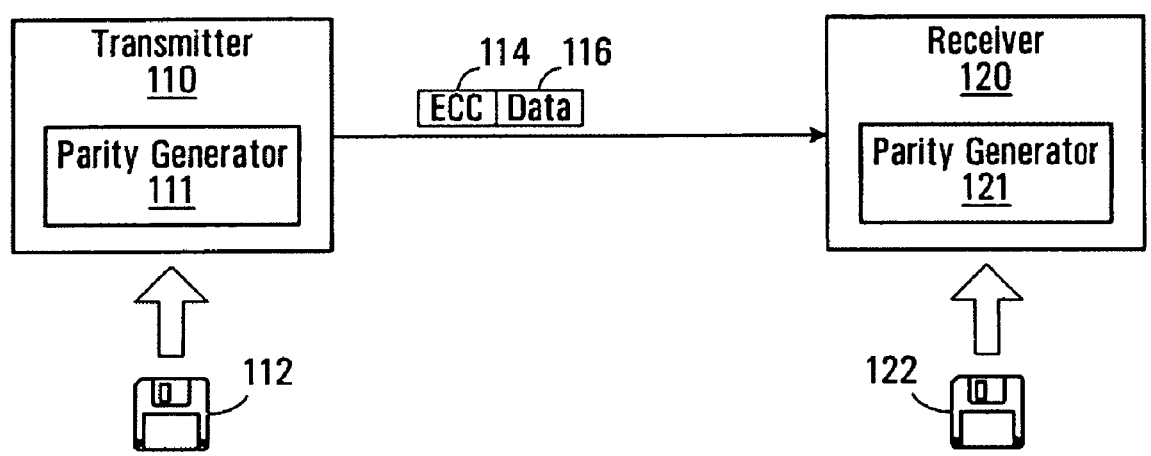
FIG. 6 is a schematic diagram of a communication system configured in accordance with an embodiment of this invention.

The transmitters and receivers of FIGS. 2 to 5, and indeed any transmitter or receiver configured to use the described error correction code approach, could be configured through hardwiring or through software. FIG. 6 illustrates a transmitter 110, the parity generator 111 of which is configured through software from computer readable media 112 to add an error correction code 114 according to this invention to sets of data bits 116 that the transmitter transmits. FIG. 6 also illustrates a receiver 120, the parity generator 121 of which is configured through software from computer readable media 122 to determine syndromes in accordance with this invention with sets of data bits and added error correction codes that are received. Computer readable media 112 and 122 could be a portable storage device, such as a computer readable CD or a flash memory device. Media 112 and 122 could also be a computer readable file downloaded from a remote source, such as the public Internet.

Figure 7:
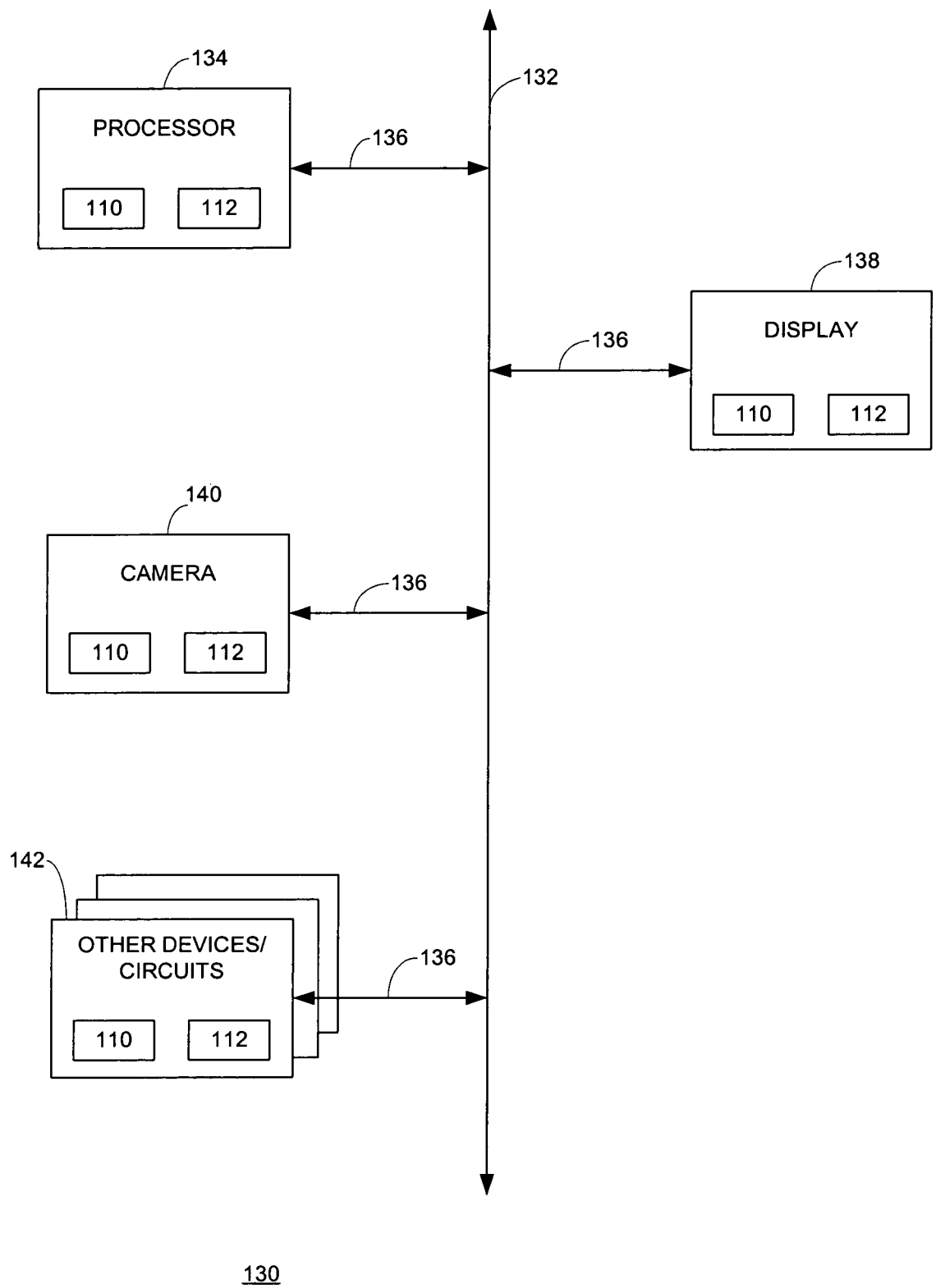
FIG. 7 is a block diagram of a device or system in accordance with an embodiment of the invention.

FIG. 7 illustrates one example of a communication device or system 130 that includes one or more of the transmitter and/or receiver configured with the described error correction code approach. The device or system 130 includes one or more communication buses 132 which may be local to the device or system 130 or may be one or more wired or wireless links through appropriate wireless or nonwireless network connections. The device or system 130 may be, for example, a cable set top box, a plasma (or LCD) display, HDTV, handheld device, game console, laptop computer, desktop computer, a video (e.g., DVD) playing device, an audio playing device such as a portable MP3 player, or any other suitable device or system. In this example, the device includes a processor 134 operatively coupled to the bus 132 through one or more suitable communication links 136 (which may be link 132) and may include if desired, one or more displays 138, a camera 140, one or more other devices or circuits 142 depending upon the type of device or system desired. The processor 134 may be one or more CPUs, DSP, state machines discrete logic or any suitable digital processing structure.

Examples of other devices or circuits 142 may include, but are not limited to, a hard drive, an audio processing engine, a video decoder and/or encoder, a printer, a removable storage device, a set top box, another processor, flash memory device or any other suitable device or circuit.

The transmitters and receivers 110 and 112 of FIGS. 2 and 6 or any transmitter or receiver configured to use the described error correction code approach may be configured in any of the processor 134, display 138, camera 140, or other device or circuit 142 so that any of these device or system components may include either a transmitter and/or receiver configured to use the described error correction code approach as described above. As such, the disclosed transmitter and/or receivers may be included in any suitable device, system or subsystem, or circuit, such as but not limited to the examples set forth herein.

Other modifications will be apparent to those skilled in the art and, therefore the invention is defined in the claims.

What is claimed is:

1. A machine implemented data bit error management method comprising:

for a set of data bits, each data bit having a data bit position in said data bit set, generating a set of at least four parity bits, each parity bit having a parity bit position in said parity bit set, said generating comprising, for a given parity bit position:

calculating a parity bit for said given parity bit position from data bits at selected data bit positions such that each data bit position is selected for inclusion in the calculation of parity bits in at least three parity bit positions, said at least three parity bit positions being a sub-set of all possible parity bit positions, and such that, for a selected data bit position included in the calculation of a given sub-set of parity bit positions, said given subset of parity bit positions is unique to said selected data bit position, a base 2 number defined by said given sub-set has a lower numerical value than does a base 2 number defined by a sub-set unique to any next higher order data bit position, and at least one other data bit position is included in the calculation of at least one parity bit position of said given sub-set of parity bit positions; and transmitting said set of data bits and said set of parity bits.

2. The method of claim 1 wherein each data bit position is included in the calculation of 2n+1 parity bits, where n is a positive integer.

3. The method of claim 2 wherein all possible sub-sets where n is 1 are chosen before any sub-sets are chosen where n is 2 and where all possible sub-sets where n is 2 are chosen before any sub-sets are chosen where n is 3.

4. The method of claim 1 wherein each data bit position is included in the calculation of 2n+2 parity bits, where n is a positive integer.

5. The method of claim 4 wherein all possible sub-sets where n is 1 are chosen before any sub-sets are chosen where n is 2 and where all possible sub-sets where n is 2 are chosen before any sub-sets are chosen where n is 3.

6. The method of claim 1 wherein the number of parity bits, p, in said set of parity bits is determined from the number of data bits, d, in said set of data bits based on the following equation:

$$d+p+1<2^p.$$

7. The method of claim 1 further comprising choosing each said sub-set so as to maximize the number of sub-sets of equal size.

8. The method of claim 1 wherein said calculating comprises applying an XOR operation serially to said data bits at said selected data bit positions.

9. A machine implemented data bit error management method comprising:

selecting a set of parity bit positions for parity bits to protect a set of data bits, each data bit having a data bit position in said data bit set, said number of parity bits being at least four;

associating each data bit position with a different syndrome, each syndrome comprising a sub-set of at least three parity bit positions, such that each said sub-set has at least one parity bit position shared with at least one other said sub-set and wherein said associating is such that a syndrome associated with a lower order data bit position equates to a word with a lower numerical value than does a syndrome associated with a next higher order data bit position;

calculating a parity bit value for each parity bit position from all data bit positions associated with said each parity bit position; and transmitting said set of data bits and said set of parity bit.

10. The method of claim 9 wherein each said sub-set has at least 2n+1 parity bit positions, where n is a positive integer.

11. The method of claim 10 wherein all possible sub-sets where n is 1 are chosen before any sub-sets are chosen where n is 2 and where all possible sub-sets where n is 2 are chosen before any sub-sets are chosen where n is 3.

12. The method of claim 9 wherein said sub-set has at least 2n+1 parity bit positions, where n is a positive integer.

13. The method of claim 11 wherein all possible sub-sets where n is 1 are chosen before any sub-sets are chosen where n is 2 and where all possible sub-sets where n is 2 are chosen before any sub-sets are chosen where n is 3.

14. The method of claim 9 further comprising choosing each said sub-set so as to maximize the number of sub-sets of equal size.

15. A computer readable storage media comprising computer readable instructions which, when controlling a parity generator, cause said parity generator to:

select a set of parity bit positions for parity bits to protect a set of data bits, each data bit having a data bit position in said data bit set, said number of parity bits being at least four;

associate each data bit position with a different syndrome, each syndrome comprising a sub-set of at least three parity bit positions, such that each said sub-set has at least one parity bit position shared with at least one other said sub-set and wherein said associating is such that a syndrome associated with a lower order data bit position defines a base 2 number with a lower numerical value than does a syndrome associated with a next higher order data bit position;

calculate a parity bit value for each parity bit position from all data bit positions associated with said each parity bit position.

16. The method of claim 15 wherein each said sub-set has at least 2n+1 parity bit positions, where n is a positive integer.

17. A transmitter comprising:

a parity generator for generating a set of at least four parity bits to protect a set of data bits, each parity bit having a parity bit position in said parity bit set, each data bit having a data bit position in said data bit set;

said parity generator associating each data bit position with a different syndrome, each syndrome comprising a sub-set of at least three parity bit positions, such that each said sub-set has at least one parity bit position shared with at least one other said sub-set and wherein said associating is such that a syndrome associated with a lower order data bit position defines a base 2 number with a lower numerical value than does a syndrome associated with a next higher order data bit position;

said parity generator calculating a parity bit value for each parity bit position from all data bit positions associated with said each parity bit position.

18. The transmitter of claim 17 wherein each said sub-set has at least 2n+1 parity bit positions, where n is a positive integer.

19. The transmitter of claim 17 further comprising a buffer for receiving said set of data bits and said set of parity bits such that said set of parity bits are appended to one end of said set of data bits.

20. A receiver comprising:

a parity generator for generating a set of at least four parity bits from a set of received data bits, each parity bit having a parity bit position in said parity bit set, each received data bit having a data bit position in said data bit set;

said parity generator associating each data bit position with a different syndrome, each syndrome comprising a sub-set of at least three parity bit positions, such that each said sub-set has at least one parity bit position shared with at least one other said sub-set and such that each data bit position is included in the calculation of 2n+2 parity bits, where n is a positive integer; and said parity generator calculating a parity bit value for each parity bit position from all data bit positions associated with said each parity bit position.

21. The receiver of claim 20 further comprising a comparator for comparing a set of parity bits calculated by said parity generator with a set of parity bits received with said set of received data bits.

22. The receiver of claim 21 further comprising a syndrome decoder operatively coupled to an output of said comparator, said syndrome decoder associating said each data bit position with said different syndrome.

23. The receiver of claim 22 further comprising a bank of correction comparators, each correction comparator input with one received data bit and with an output of said syndrome decoder, said bank of correction comparators outputting a set of data bits from said receiver.

24. The receiver of claim 23 wherein said syndrome decoder has outputs to indicate no error, a corrected error, and an indeterminate error.

25. The receiver of claim 24 wherein said set of received data bits is three data bits in size and said set of parity bits is six parity bits in size.

26. The receiver of claim 24 wherein said set of received data bits is eight data bits in size and said set of parity bits is eight parity bits in size.

27. A system for managing data errors, comprising:

a transmitter comprising:

a transmitter parity generator for generating a set of at least four parity bits to protect a set of data bits, each parity bit having a parity bit position in said parity bit set, each data bit having a data bit position in said data bit set;

said transmitter parity generator associating each data bit position with a different syndrome, each syndrome comprising a sub-set of at least three parity bit positions, such that each said sub-set has at least one parity bit position shared with at least one other said sub-set and wherein said associating is such that a syndrome associated with a lower order data bit position defines a base 2 number with a lower numerical value than does a syndrome associated with a next higher order data bit position; and said transmitter parity generator calculating a parity bit value for each parity bit position from all data bit positions associated with said each parity bit position; and a receiver comprising:

a receiver parity generator for generating a set of at least four parity bits from a set of received data bits, each parity bit having a parity bit position in said parity bit set, each received data bit having a data bit position in said data bit set;

said receiver parity generator associating each data bit position with a different syndrome, each syndrome comprising a sub-set of at least three parity bit positions, such that each said sub-set has at least one parity bit position shared with at least one other said sub-set; and said receiver parity generator calculating a parity bit value for each parity bit position from all data bit positions associated with said each parity bit position.

28. Apparatus to transmit a data packet comprising:

said data packet having a header and payload data, said header comprising a data length word based on a length of said payload data, and an error management code dependent on said data length word;

a parity generator for deriving said error management code, said parity generator generating a set of at least four parity bits to protect said data length word, each parity bit having a parity bit position in said parity bit set, each data bit in said data length word having a data bit position in said data length word;

said parity generator associating each data bit position with a different syndrome, each syndrome comprising a sub-set of at least three parity bit positions, such that each said sub-set has at least one parity bit position shared with at least one other said sub-set and such that a base 2 number defined by a syndrome associated with a lower order data bit position has a lower numerical value than does a base 2 number defined by a syndrome associated with a next higher order data bit position; and said parity generator calculating a parity bit value for each parity bit position from all data bit positions associated with said each parity bit position.

29. Apparatus to receive a data packet comprising:

said data packet comprising a header and payload data; said header comprising a data length word, and a received error management code;

a parity generator for deriving a calculated error management code, said parity generator generating a set of at least four parity bits from said data length word, each parity bit having a parity bit position in said parity bit set, each data bit in said data length word having a data bit position in said data length word;

said parity generator associating each data bit position with a different syndrome, each syndrome comprising a sub-set of at least three parity bit positions, such that each said sub-set has at least one parity bit position shared with at least one other said sub-set and wherein said associating is such that a syndrome associated with a lower order data bit position defines a base 2 number with a lower numerical value than does a syndrome associated with a next higher order data bit position; and said parity generator calculating a parity bit value for each parity bit position from all data bit positions associated with said each parity bit position.

30. The apparatus of claim 29 further comprising a comparator for comparing said received error management code with said calculated error management code and, based on said comparison, selectively correcting said data length word.

* * * * *

UNITED STATES PATENT AND TRADEMARK OFFICE
CERTIFICATE OF CORRECTION

PATENT NO. : 7,596,743 B2
APPLICATION NO. : 11/236921
DATED : September 29, 2009
INVENTOR(S) : Goma et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 988 days.

Signed and Sealed this

Twenty-eighth Day of September, 2010

David J. Kappos
*Director of the United States Patent and Trademark Office*